United States Patent
Subramanian et al.

(10) Patent No.: US 6,319,802 B1
(45) Date of Patent: Nov. 20, 2001

(54) T-GATE FORMATION USING MODIFIED DAMASCENE PROCESSING WITH TWO MASKS

(75) Inventors: Ramkumar Subramanian, San Jose; Christopher F. Lyons, Fremont; Bhanwar Singh, Morgan Hill; Marina Plat, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/620,145

(22) Filed: Jul. 20, 2000

(51) Int. Cl.[7] ................................. H01L 21/3205
(52) U.S. Cl. ................ 438/585; 438/182; 438/574; 438/579
(58) Field of Search ................ 438/585, 182–184, 438/574, 579, 299

(56) References Cited

U.S. PATENT DOCUMENTS

| | | | |
|---|---|---|---|
| 4,795,718 | * 1/1989 | Beitman | 438/297 |
| 4,980,316 | 12/1990 | Huebner . | |
| 5,155,053 | 10/1992 | Atkinson . | |
| 5,498,560 | * 3/1996 | Sharma et al. | 438/261 |
| 5,550,065 | * 8/1996 | Hashemi et al. | 438/182 |
| 5,559,049 | * 9/1996 | Cho | 438/304 |
| 5,677,089 | 10/1997 | Park et al. . | |
| 5,891,783 | * 4/1999 | Lin et al. | 438/302 |
| 5,930,610 | 7/1999 | Lee . | |
| 5,981,383 | * 11/1999 | Lur et al. | 438/655 |
| 6,124,177 | * 9/2000 | Lin et al. | 438/305 |

FOREIGN PATENT DOCUMENTS

| | | | | |
|---|---|---|---|---|
| 403268434 | * 11/1991 | (JP) | | H01L/21/336 |
| 407321124 | * 12/1995 | (JP) | | H10L/21/331 |
| 408195401 | * 7/1996 | (JP) | | H01L/21/331 |

* cited by examiner

*Primary Examiner*—Charles Bowers
*Assistant Examiner*—Thanh Nguyen
(74) *Attorney, Agent, or Firm*—Amin & Turocy, LLP

(57) ABSTRACT

A method for fabricating a T-gate structure is provided. A structure is provided that has a silicon layer having a gate oxide layer, a protection layer over the gate oxide layer and a sacrificial layer over the protection layer. An opening is then formed in the sacrificial layer. A contact material is deposited over the sacrificial layer filling the opening with the contact material and forming a contact layer. Portions of the contact material outside a gate region are then removed. Finally, the sacrificial layer and portions of the protection layer and the gate oxide layer not forming a part of the T-gate structure are removed.

20 Claims, 5 Drawing Sheets

T-GATE FORMATION USING MODIFIED DAMASCENE PROCESSING WITH TWO MASKS

TECHNICAL FIELD

The present invention generally relates to semiconductor processing, and in particular to a method for forming a gate structure with a contact area wider than a base area.

BACKGROUND OF THE INVENTION

Historically, gate structures having a base area with a width that is smaller than the gate contact area (e.g., T-gate and Y-gate structures) have been advantageous in several technologies. For example, MESFET, HEMT (variant of gallium arsenide field effect transistor technology) mainly used in satellite broadcasting receivers, high speed logic circuits and power modules have employed gate structures with bases smaller than the contact area. These types of devices are required in field effect transistors for operation in ultra-high frequency ranges. The advantage of employing a gate structure with a shorter gate length is that the channel of the gate is reduced resulting in an increased in speed and a decrease in power consumption. Reducing the distance over which the gate's field effect control of the electrons in the channel reduces the parasitic resistances and capacitances that limit device speed. A shorter gate length decreases the transmit time for carriers in the channel but also increases the series resistance of the gate electrode itself, slowing down the device and degrading the frequency characteristics of the device. Providing a gate structure with a smaller base than its contact area decreases the gate channel while providing a low gate series resistance due to the wider contact area and, thus, improving the devices drive current capability and performance.

In the semiconductor industry, there is a continuing trend toward higher device densities. To achieve these high densities there has been and continues to be efforts toward scaling down device dimensions at submicron levels on semiconductor wafers. In order to accomplish such high device packing density, smaller and smaller feature sizes are required. This may include the width and spacing of interconnecting lines and the surface geometry such as comers and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Recent advances in CMOS transistor architecture make use of the T-gate or Y-gate structures where the polysilicon gate electrode is narrowed in the gate regions and wider on top of the gate. This is due to the ever increasing demand for scaling down semiconductor devices and scaling down power consumption requirements. However, the current methods for forming a gate structure with a contact region wider than its base suffers from shortcomings. For example, the etch process which narrows the base of the structure are known to be difficult to control especially with local pattern density. This can lead to variation in the gate width and asymmetric implant profiles. Another problem is related to manufacturing controls. The "re-entrant" or overhung profile prevents direct measurement of the critical gate length.

In view of the above, there is an unmet need for improvements in methodologies for formation of gate structures with contact areas that are wider than the base area.

SUMMARY OF THE INVENTION

One aspect of the invention relates to a method for fabricating a T-gate structure. A structure is provided that has a silicon layer having a gate oxide layer, a protection layer over the gate oxide layer and a sacrificial layer over the protection layer. An opening is then formed in the sacrificial layer. A contact material is deposited over the sacrificial layer filling the opening with the contact material and forming a contact layer. Portions of the contact material outside a gate region are then removed. Finally, the sacrificial layer and portions of the protection layer and the gate oxide layer not forming a part of the T-gate structure are removed.

Another aspect of the present invention relates to another method for fabricating a T-gate structure. A structure is provided that has a silicon layer having a gate oxide layer, a protection layer over the gate oxide layer and a sacrificial layer over the protection layer. The protection layer is one of a polysilicon and a germanium material. An opening is then formed in the sacrificial layer. A contact material is deposited over the sacrificial layer filling the opening with the contact material and forming a contact layer. The contact material is the other of a polysilicon material and a germanium material. Portions of the contact material outside a gate region are then removed. Finally, the sacrificial layer portions of the protection layer and the gate oxide layer not forming a part of the T-gate structure are removed.

Yet another aspect of the present invention provides for yet another method for fabricating a T-gate structure. A structure is provided that has a silicon layer having a gate oxide layer, a protection layer having a thickness within the range of about 50 Å to 150 Å over the gate oxide layer and a sacrificial layer having a thickness within the range of about 400 Å to 600 Å over the protection layer. The protection layer is one of a polysilicon and a germanium material. An opening is then etched in the sacrificial layer. A polysilicon material is deposited over the sacrificial layer filling the opening with the polysilicon material and forming a polysilicon layer. Portions of the polysilicon material outside a gate region are then removed. Finally, the sacrificial layer is removed and portions of the protection layer and the gate oxide layer not forming a part of the T-gate structure are etched away using one of a wet etch and vertical plasma etch.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
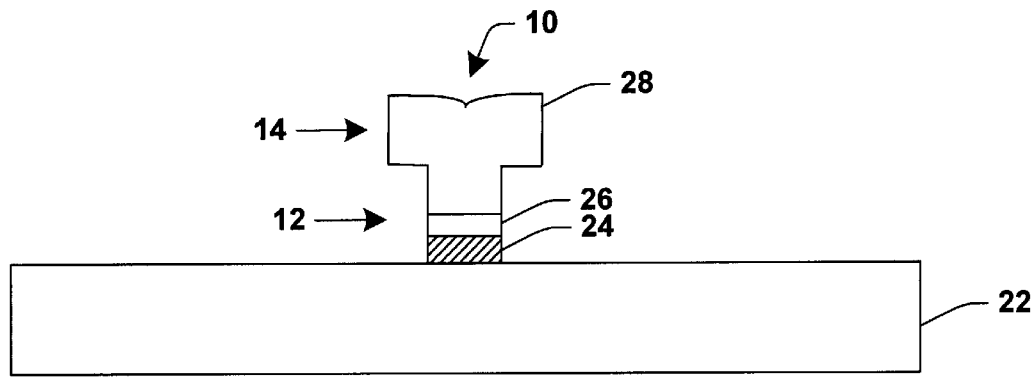
FIG. 1 is a schematic cross-sectional illustration of a T-gate structure overlying a silicon layer in accordance with one aspect of the invention.

The present invention will now be described with reference to the drawings, wherein like reference numerals are used to refer to like elements throughout. The present invention is described with reference to a method for forming a T-gate structure over a silicon layer to form a semiconductor with more speed and less power consumption. It is to be understood that the description of the various aspects of the present invention are merely illustrative and that they should not be taken in a limiting sense.

FIG. 1 illustrates a T-gate structure 10 according to the present invention. The T-gate structure 10 resides over a silicon layer 22 and includes a base portion 12 and a top or contact portion 14. The base portion 12 has a gate oxide layer 24 and a silicon layer 26. The top or contact portion 14 is the gate contact area and can be comprised of polysilicon, germanium, amorphous silicon, metals or the like. A portion of the material forming the top or contact portion forms a part of the base portion. The base portion 12 has a width that is smaller than the top portion 14.

Figure 2:
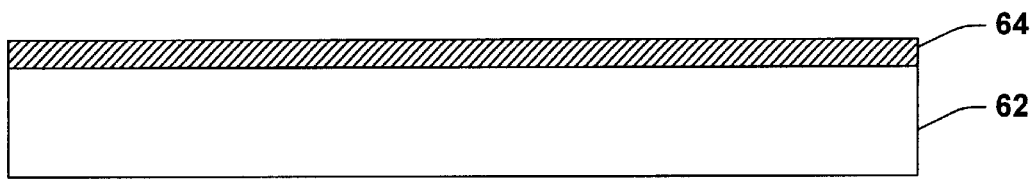
FIG. 2 is a schematic cross-sectional illustration of a silicon layer having a gate oxide layer in accordance with one aspect of the present invention.
Figure 3:
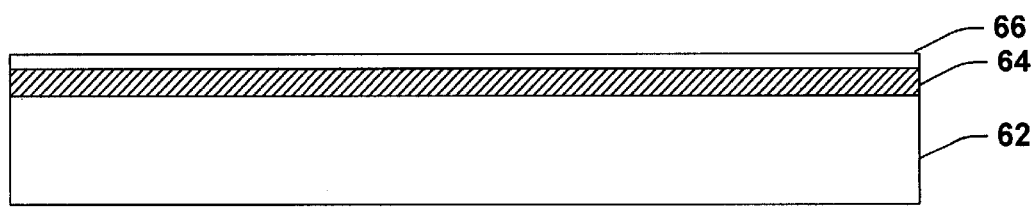
FIG. 3 is a schematic cross-sectional illustration of the structure of FIG. 2 having a protection layer over the gate oxide layer in accordance with one aspect of the present invention.

FIGS. 2–14 illustrate a methodology of fabricating the T-gate structure of the present invention. FIG. 2 illustrates a structure 60 having a gate oxide layer 64 disposed over a silicon layer 62. The thin gate oxide material 64 is formed to have a thickness within the range of about 10–20 Å. Preferably, the thin gate oxide material 64 includes $SiO_2$ which has a substantially low dielectric constant. However, it is to be appreciated that any suitable material (e.g., $Si_3N_4$) for carrying out the present invention may be employed and is intended to fall within the scope of the present invention. A thin protection layer 66 is formed over the gate oxide material 64, as illustrated in FIG. 3. The thin protection layer 66 may be formed from polysilicon. Alternatively, the thin protection layer 66 may be formed from germanium. Preferably, the protection layer 66 is doped prior to the formation of the protection layer 66 over the gate oxide material 64. The protection layer 66 may have a thickness within the range of about 50 Å–150 Å.

Figure 4:
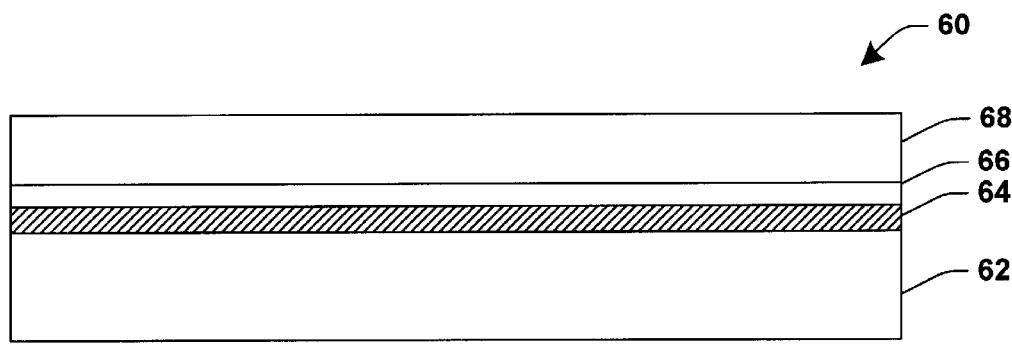
FIG. 4 is a schematic cross-sectional illustration of the structure of FIG. 3 having a sacrificial layer over the protection layer in accordance with one aspect of the present invention.
Figure 5:
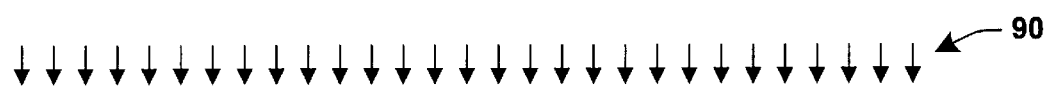
FIG. 5 is a schematic cross-sectional illustration of the structure of FIG. 4 undergoing an etching step in accordance with one aspect of the present invention.
Figure 5:
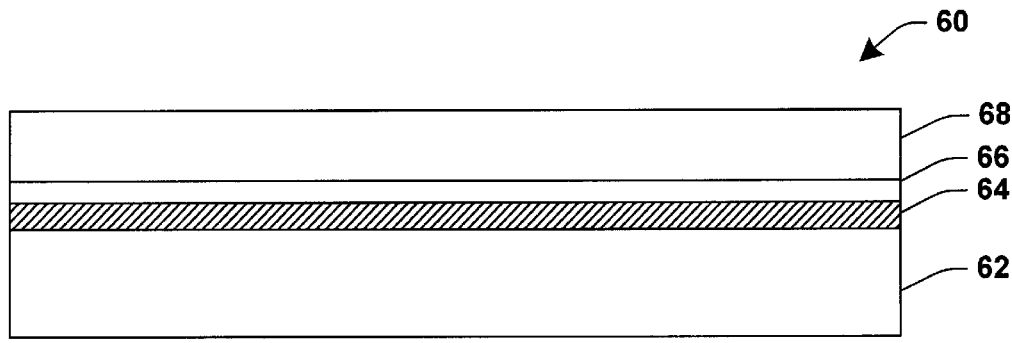

A sacrificial layer 68 is formed over the thin protection layer 66 (FIG. 4). Any suitable technique (e.g., thermal oxidation, plasma enhanced chemical vapor deposition (CVD), thermal enhanced CVD and spin on techniques) may be employed in forming the sacrificial layer 68. Preferably, the sacrificial layer 68 is silicon dioxide ($SiO_2$) or silicon nitride (SiN) with a thickness within the range of about 400 Å–600 Å. Other usuable sacrificial materials may be employed such as silicon nitride ($Si_3N_4$), silicon oxynitride ($SiO_xN_y$), and fluorinated silicon oxide ($SiO_xF_y$), and polyimide(s).

Figure 6:
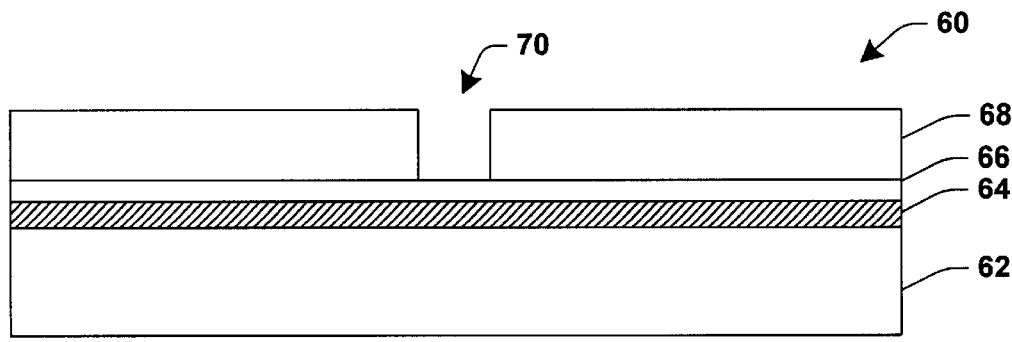
FIG. 6 is a schematic cross-sectional illustration of the structure of FIG. 5 after the sacrificial layer has been etched in accordance with one aspect of the present invention.
Figure 7:
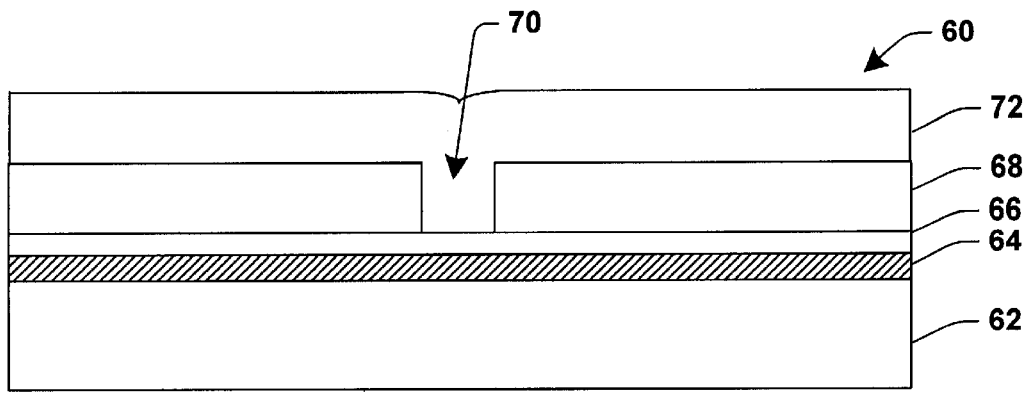
FIG. 7 is a schematic cross-sectional illustration of the structure of FIG. 6 after a deposition step in accordance with one aspect of the present invention.

An etch step 100 (e.g., anisotropic reactive ion etching (RIE)) (FIG. 5) is performed to form an opening 70 in the sacrificial layer 68 (FIG. 6). A photoresist layer is first patterned (not shown) and is used as a mask for selectively etching the sacrificial layer 68 to provide the opening 70 in the sacrificial layer 68. Any suitable etch technique may be used to etch the sacrificial layer 68. For example, the insulating layer 68 can be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate a mask pattern to pattern a photoresist layer (not shown). The photoresist is etched using a dark field mask employing a positive resist or in the alternative with a clear field mask with a negative resist to form the opening in the photoresist. A selective etch is then performed employing the photoresist as a mask to thereby create the opening 70 in the sacrificial layer 68. Preferably, a selective etch technique is used to etch the material of the sacrificial layer 68 at a relatively greater rate as compared to the rate that the material of the patterned photoresist (not shown) and at a relatively greater rate as compared to the rate that the material of the underlying protection layer 66.

Next, a damascene fill or deposition step is performed on the structure 60 (FIG.7) to form a contact layer 72 over the structure 60. The contact layer 72 can be comprised of polysilicon, amorphous silicon, germanium, metals or the like. If the contact layer 72 is comprised of polysilicon, the contact layer 72 may be formed using any suitable technique including chemical vapor deposition (CVD) techniques, such as low pressure chemical vapor deposition (LPCVD) or plasma enhanced chemical vapor deposition (PECVD). If the contact layer 72 is comprised of amorphous silicon or germanium, standard deposition techniques may be employed. If the contact layer 72 is comprised of a metal, standard sputtering techniques may be employed.

Figure 8:
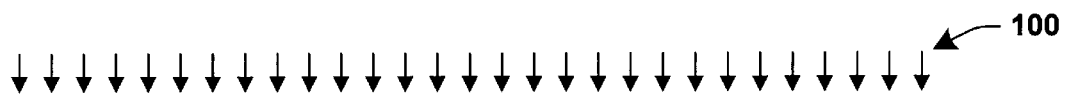
FIG. 8 is a schematic cross-sectional illustration of the structure of FIG. 7 undergoing another etching step in accordance with one aspect of the present invention.
Figure 8:
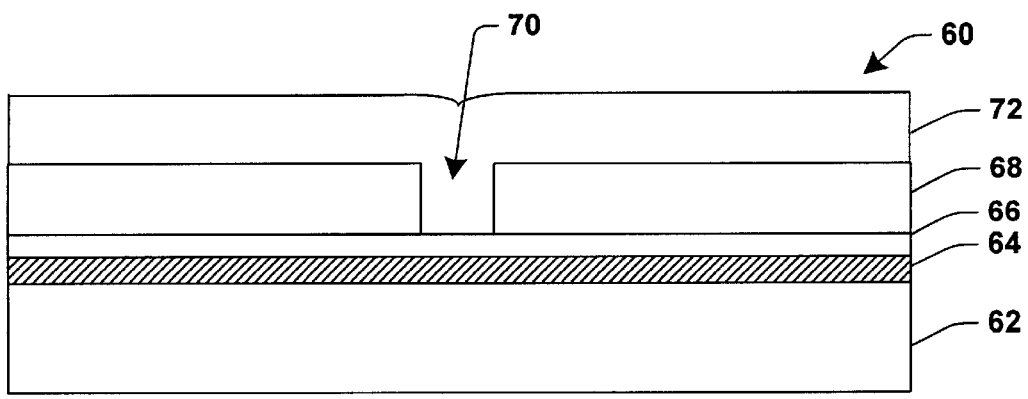
Figure 9:
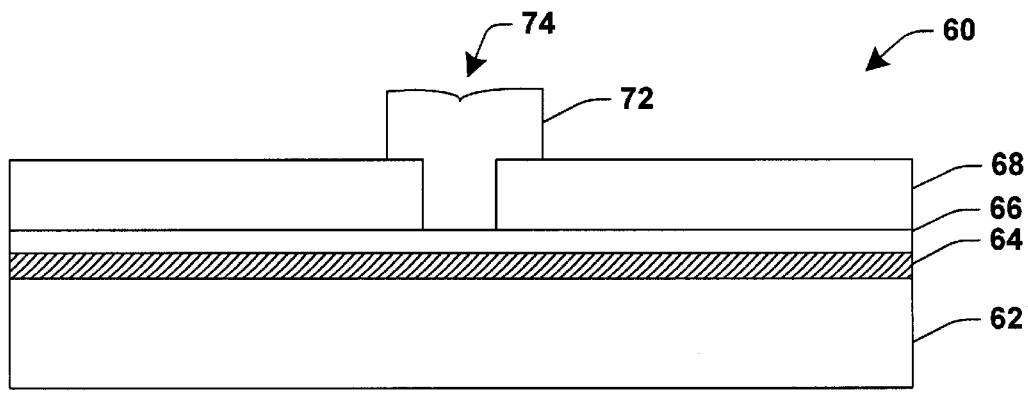
FIG. 9 is a schematic cross-sectional illustration of the structure of FIG. 8 after undergoing another etching step in accordance with one aspect of the present invention.
Figure 10:
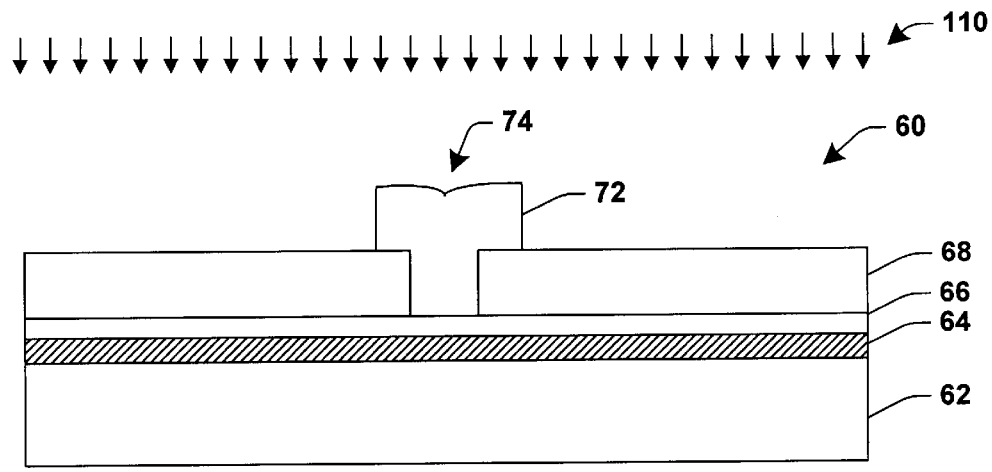
FIG. 10 is a schematic cross-sectional illustration of the structure of FIG. 9 undergoing a stripping step in accordance with one aspect of the present invention.

FIG. 8 illustrates the structure 60 undergoing a second etch step 100 to remove portions of the contact layer 72 outside a T-gate region to form a T-gate structure 74 (FIG. 9). A mask reverse of the mask employed to form the opening 70 may be utilized to form the T-gate structure 74. For example, if a dark field mask is employed with a positive resist to form the opening 70, a clear field mask may be employed to form the T-gate structure 74. Alternatively, if a clear field mask is employed with a negative resist to form the opening 70, a dark field mask may be employed to form the T-gate structure 74. However, it is to be appreciated that any etching that accomplished the formation of the T-gate structure 74 may be employed to carry out the present invention. For example, the contact layer 72 can be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to form the T-gate structure 74. Preferably, a selective etch technique is used to etch the material of the contact layer 72 at a relatively greater rate as compared to the rate that the material of the sacrificial layer 68 and the patterned photoresist (not shown).

Figure 11:
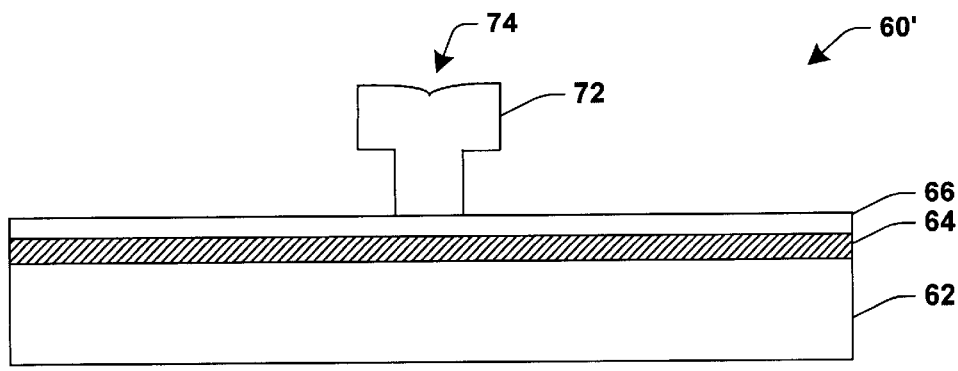
FIG. 11 is a schematic cross-sectional illustration of the structure of FIG. 10 after undergoing a stripping step in accordance with one aspect of the present invention.
Figure 12:
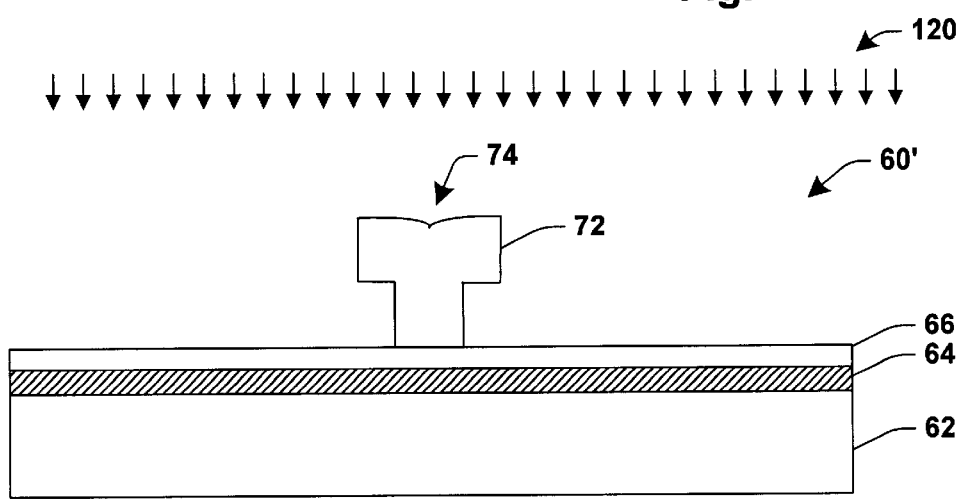
FIG. 12 is a schematic cross-sectional illustration of the structure of FIG. 11 undergoing a protection layer and a gate oxide layer removal step in accordance with one aspect of the present invention.
Figure 13:
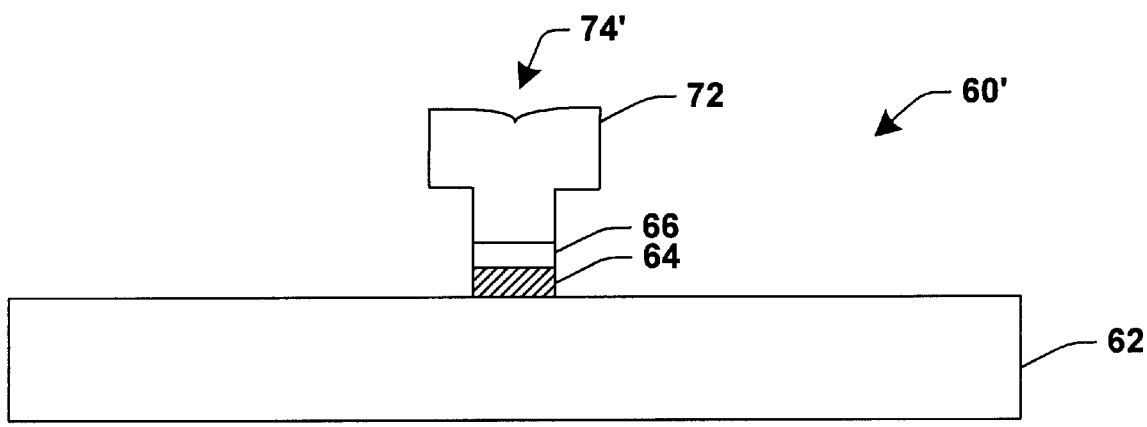
FIG. 13 is a schematic cross-sectional illustration of the structure of FIG. 12 after undergoing a protection layer and a gate oxide layer removal step in accordance with one aspect of the present invention.

A stripping step 110 (FIG. 10) is then performed to remove the sacrificial layer 68 to form the structure 60', as illustrated in FIG. 11. After the sacrificial layer 68 is removed an etch step 120 is performed (FIG. 12) to remove portions of the sacrificial layer 66 and the gate oxide layer 64 that do not form part of the gate structure 74. The etch step 120 may be a wet etch, for example, hydrofluoric acid (HF) may be employed via an HF dip to remove portions of the sacrificial layer 66 and the gate oxide layer 64 that do not form part of the gate structure 74. However any suitable wet etch technique can be utilized to remove portions of the sacrificial layer 66 and the gate oxide layer 64 that do not form part of the gate structure 74. Alternatively, the etch step 120 may be a vertical plasma etch. If the protection layer 66 is germanium and the contact layer polysilicon, it may be easier to remove the germanium as compared to a protection layer 66 of polysilicon due to the differences in the material. Additionally, if the protection layer 66 is polysilicon and the contact layer germanium, it may be easier to remove the polysilicon as compared to a protection layer 66 of germanium due to the differences in the material. This is because a selective etch technique can be employed that etches one of the polysilicon or germanium at a relatively greater rate as compared to the rate of the other material. During the etch step 120, the T-gate structure 74 loses about the same thickness as the thickness of the protection layer 66 if the same material is employed for the contact layer 72 and the protection layer 66 to result in a T-gate structure 74', as illustrated in FIG. 13. However, due to the thickness of the T-gate structure 74 the gate operation is not affected.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A method for fabricating a T-gate structure comprising the steps of:
   providing a silicon layer having a gate oxide layer, a protection layer over the gate oxide layer and a sacrificial layer over the protection layer;
   forming an opening in the sacrificial layer;
   depositing a contact material over the sacrificial layer filling the opening with the contact material and forming a contact layer;
   removing portions of the contact material outside a gate region; and
   removing the sacrificial layer and portions of the protection layer and the gate oxide layer not forming a part of the T-gate structure.

2. The method of claim 1, the sacrificial layer including at least one of silicon oxide, silicon dioxide, silicon nitride ($Si_3N_4$), (SiN), silicon oxynitride, ($SiO_xN_y$), fluorinated silicon oxide ($SiO_xN_y$), and polyimide(s).

3. The method of claim 1, the step of depositing a contact material comprising the step of depositing with one of polysilicon, germanium, amorphous polysilicon and metal.

4. The method of claim 1, the step of forming an opening in the sacrificial layer comprising etching the sacrificial layer to form a first opening in a photoresist layer to expose the sacrificial layer and a second step of etching the exposed sacrificial layer to form the opening.

5. The method of claim 4, the first etching step being employed utilizing a dark field mask with a positive resist.

6. The method of claim 5, the step of removing portions of the contact material outside a gate region comprising performing an etch step employing a clear field mask.

7. The method of claim 4, the first etching step being employed utilizing a clear field mask with a negative resist.

8. The method of claim 7, the step of removing portions of the contact material outside a gate region comprising performing an etch step employing a dark field mask.

9. The method of claim 4, the first etch step being highly selective to the photoresist layer over the underlying sacrificial layer.

10. The method of claim 4, the second etch step being highly selective to the sacrificial layer over the photoresist layer and the underlying protection layer.

11. The method of claim 1, the step of removing portions of the sacrificial layer, the protection layer and the gate oxide layer not forming a part of the T-gate structure comprising performing a wet etch.

12. The method of claim 1, the step of removing portions of the sacrificial layer, the protection layer and the gate oxide layer not forming a part of the T-gate structure comprising performing a vertical plasma etch.

13. The method of claim 1, the protection layer being formed from one of polysilicon and germanium.

14. The method of claim 1, further including the step of forming the protection layer to have a thickness within the range of about 50 Å to 150 Å.

15. The method of claim 1, further including the step of forming the sacrificial layer to have a thickness within the range of about 400 Å to 600 Å.

16. A method for fabricating a T-gate structure comprising the steps of:
   providing a silicon layer having a gate oxide layer, a protection layer over the gate oxide layer and a sacrificial layer over the protection layer, the protection layer being one of a polysilicon and a germanium material;

forming an opening in the sacrificial layer;

depositing a contact material over the sacrificial layer filling the opening with the contact material and forming a contact layer, the contact material being one of a polysilicon material and a germanium material;

removing portions of the contact material outside a gate region; and removing the sacrificial layer and portions of the protection layer and the gate oxide layer not forming a part of the T-gate structure.

17. The method of claim 16, the sacrificial layer including at least one of silicon oxide, silicon dioxide, silicon nitride ($Si_3N_4$), (SiN), silicon oxynitride, ($SiO_xN_y$), fluorinated silicon oxide ($SiO_xF_y$), and polyimide(s).

18. The method of claim 16, further including the step of forming the protection layer to have a thickness within the range of about 50 Å to 150 Å.

19. The method of claim 16, further including the step of forming the sacrificial layer to have a thickness within the range of about 400 Å to 600 Å.

20. A method for fabricating a T-gate structure comprising the steps of:

providing a silicon layer having a gate oxide layer, a protection layer having a thickness within the range of about 50 Å to 150 Å over the gate oxide layer and a sacrificial layer having a thickness within the range of about 400 Å to 600 Å over the protection layer, the protection layer being formed from one of a polysilicon and germanium material;

etching an opening in the sacrificial layer;

depositing a polysilicon material over the sacrificial layer filling the opening with the polysilicon material and forming a polysilicon layer;

removing portions of the polysilicon material outside a gate region;

removing the sacrificial layer; and etching portions of the protection layer and the gate oxide layer not forming a part of the T-gate structure using one of a wet etch and a vertical plasma etch.

* * * * *

UNITED STATES PATENT AND TRADEMARK OFFICE
CERTIFICATE OF CORRECTION

PATENT NO. : 6,319,802 B1
DATED : November 20, 2001
INVENTOR(S) : Ramkumar Subramanian et al.

It is certified that error appears in the above-identified patent and that said Letters Patent is hereby corrected as shown below:

Column 1,
Line 43, please replace "comers" with -- corners --.

Column 2,
Line 20, please replace "fluorinated" with -- fluonated --.

Claim 17,
Line 13, please replace "fluorinated" with -- fluonated --.

Signed and Sealed this

Twenty-sixth Day of March, 2002

Attest:

JAMES E. ROGAN
*Attesting Officer*   *Director of the United States Patent and Trademark Office*